(12) United States Patent
Toyoda et al.

(10) Patent No.: US 6,759,697 B2
(45) Date of Patent: Jul. 6, 2004

(54) HETEROJUNCTION BIPOLAR TRANSISTOR

(75) Inventors: Kenji Toyoda, Osaka (JP); Koichiro Yuki, Osaka (JP); Takeshi Takagi, Kyoto (JP); Teruhito Ohnishi, Osaka (JP); Minoru Kubo, Mie (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/461,364

(22) Filed: Jun. 16, 2003

(65) Prior Publication Data

US 2003/0213977 A1 Nov. 20, 2003

Related U.S. Application Data

(62) Division of application No. 09/948,112, filed on Sep. 7, 2001, now abandoned.

(30) Foreign Application Priority Data

Sep. 11, 2000 (JP) ........................................ 2000-274877

(51) Int. Cl.$^7$ ............................................. H01L 29/737
(52) U.S. Cl. ........................................ 257/197; 257/616
(58) Field of Search ................................ 257/197, 198, 257/616

(56) References Cited

U.S. PATENT DOCUMENTS

| 4,885,614 A | 12/1989 | Furukawa et al. |
| 5,508,537 A | 4/1996 | Imai |
| 5,721,438 A | 2/1998 | Tang et al. |
| 5,986,287 A | 11/1999 | Eberl et al. |

FOREIGN PATENT DOCUMENTS

| EP | 1 085 728 A2 | 1/2001 |
| JP | 64-2360 A | 1/1989 |
| JP | 1-231371 A | 9/1989 |
| JP | 2-309644 A | 12/1990 |
| JP | 4-106980 A | 4/1992 |
| JP | 5-102177 | 4/1993 |
| JP | 5-182980 A | 7/1993 |
| JP | 7-193078 A | 7/1995 |
| JP | 9-260397 A | 10/1997 |
| JP | 2000-31162 | 1/2000 |
| WO | WO 98/26457 | 6/1998 |

OTHER PUBLICATIONS

L.D. Lanzeriotti et al., "Si/Si$_{1-x-y}$Ge$_x$C$_y$/Si Heterojunction Bipolar Transistors", IEEE Electrode Device Letters, vol. 17, No. 7, Jul. 1996.

Lanzerotti et al., "Suppression of boron transient enhanced diffusion in SiGe heterojunction bipolar transistor by carbon incorporation," Appl. Phys. Lett., vol. 70 (23), Jun. 9, 1997, pp. 3125–3127.

Osten et al., "Effects of carbon on boron diffusion in SiGe: Principles and impace on bipolar devices," J. Vac. Sci. Technol. B 16(3) May/Jun. 1998, pp. 1750–1753.

Liu et al., "Substitutional carbon incorporation during SiGeC growth on Si(100) by molecular–beam epitaxy: Dependence of germanium and carbon, "Appl. Phys. Lett., vol. 76 (24), Jun. 12, 2000, pp. 3546–3548.

(List continued on next page.)

Primary Examiner—Bradley Baumeister
(74) Attorney, Agent, or Firm—McDermott, Will & Emery

(57) ABSTRACT

The bipolar transistor of the present invention includes a Si collector buried layer, a first base region made of a SiGeC layer having a high C content, a second base region made of a SiGeC layer having a low C content or a SiGe layer, and a Si cap layer 14 including an emitter region. The C content is less than 0.8% in at least the emitter-side boundary portion of the second base region. This suppresses formation of recombination centers due to a high C content in a depletion layer at the emitter-base junction, and improves electric characteristics such as the gain thanks to reduction in recombination current, while low-voltage driving is maintained.

13 Claims, 12 Drawing Sheets

OTHER PUBLICATIONS

Sankaran Jayanarayanan et al., "Potential for Silicon–Germanium–Carbon HBT Operation at Cryogenic Temperatures", Electrochemical Society Proceedings vol. 97–2, pp. 240–245, 1997.

L.D. Lanzerotti et al., "Suppression of Boron Outdiffusion in SiGe HBTs by Carbon Incorporation", IEDM–96, pp. 10.2.1–10.2.4, 1996.

D. Knoll et al., "Comparison of SiGe and SiGe:C heterojunction bipolar transistors", Thin Solid Films, vol. 369, pp. 342–346, 2000.

A. Biswas et al., "Calculation of figures of merit of $Si/Si_{1-x-y}Ge_xC_y/Si$ HBTs and their optimization", Solid–State Electrons vol. 45, pp. 1885–1889, 2001.

Gary L. Patton et al., "Graded–SiGe–Base, Poly–Emitter Heterojunction Transistors", IEEE Electron Device Letters, vol. 10, No. 12, pp. 534–536, Dec. 1989.

M.S. Carroll et al., "Quantitative Measurement of Reduction of Boron Diffusion by Substitutional Carbon Incorporation", Materials Research Society Symposium Proceedings, vol. 527, pp. 417–422, 1998.

William E. Ansley et al., Base–Profile Optimization for Minimum Noise Figure in Advanced UHV/CVD SiGe HBT's, IEEE Transactions on Microwave theory and Techniques, vol. 46, No. 5, pp. 653–660, May 1998.

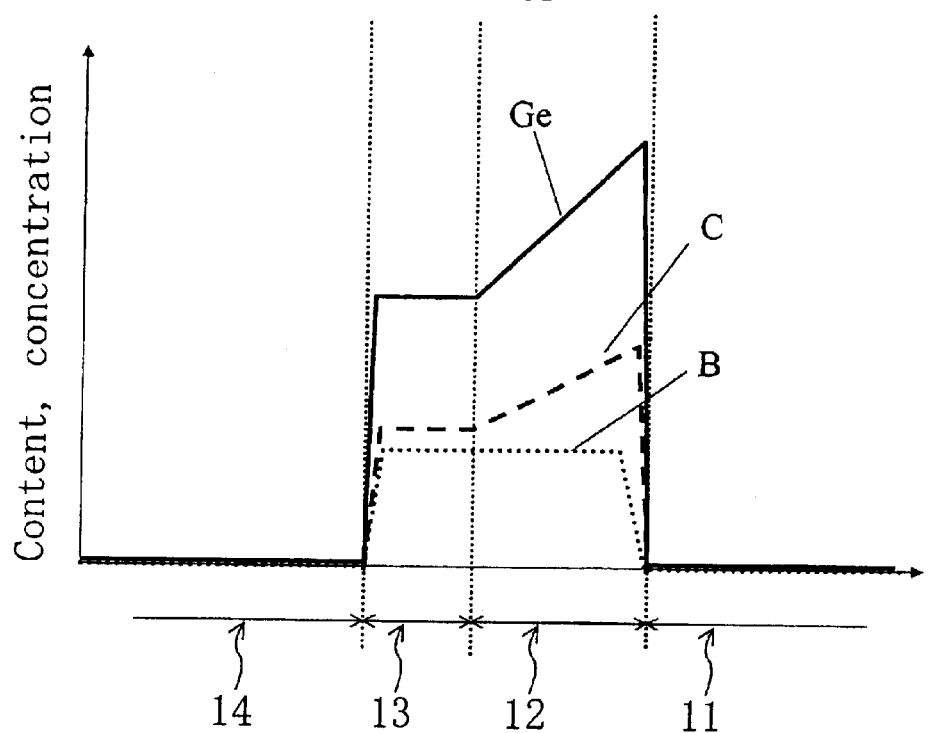
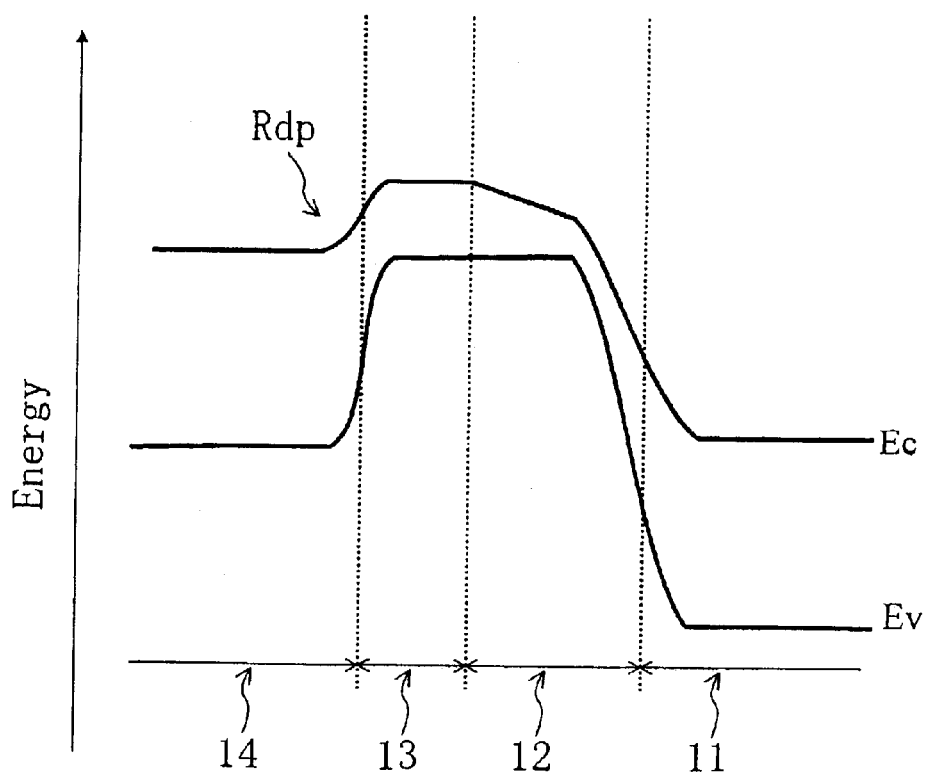

SiGe$_{0.268}$ HBT Gummel plot

SiGe$_{0.268}$C$_{0.0091}$HBT Gummel plot

Current multiplication factor of SiGe$_{0.268}$ HBT

Current multiplication factor of SiGe$_{0.268}$C$_{0.0091}$HBT

Gummel plot

Current multiplication factor

| Wf. | S | D2 | $N_{G2}$ | $N_{C2}$ | $N_{B2}$ | D1 | $N_{G1}$ | $N_{C1}$ | $N_{B1}$ |
|---|---|---|---|---|---|---|---|---|---|
| 1 | 10nm | 0nm | - | - | - | 90nm | 21.5% | 1.2% | 2.0E+18 |
| 2 | " | 10nm | " | 0.33% | " | 80nm | " | " | " |
| 3 | " | 20nm | " | 0.33% | " | 70nm | " | " | " |
| 4 | " | 30nm | " | 0.33% | " | 60nm | " | " | " |

HETEROJUNCTION BIPOLAR TRANSISTOR

This application is a divisional of application Ser. No. 09/948,112, filed Sep. 7, 2001 now abandoned.

BACKGROUND OF THE INVENTION

The present invention relates to a heterojunction bipolar transistor using a semiconductor layer including silicon, and in particular, relates to measures taken to reduce the driving voltage of the heterojunction bipolar transistor.

Conventionally, a heterojunction bipolar transistor (HBT) has attracted attention as a high-function element. The HBT is a transistor in which the compositions of an emitter and a base are determined to ensure that the band gap of the emitter is larger than that of the base, to thereby substantially improve the injection efficiency of the emitter and thus improve the characteristics of the transistor. The HBT, which is particularly excellent in high-frequency characteristics, is now gradually finding applications as devices in microwave/millimeter wave high frequency bands. The HBT was conventionally fabricated using a combination of GaAs and AlGaAs that are III-V group compound semiconductors, and the like. In recent years, a SiGe HBT that uses SiGe, which has a band gap smaller than Si, as a base layer is under vigorous research and development.

The SiGe HBT utilizes the fact that the band gap of Ge (0.66 eV at room temperature) is smaller than the band gap of Si (1.12 eV at room temperature) and therefore the band gap of SiGe mixed crystal is smaller than that of Si. By using a Si layer as the emitter region and a SiGe layer as the base region, to ensure that the band gap of the base region is smaller than that of the emitter region, the resultant HBT can be driven at a voltage lower than the driving voltage of a Si homojunction bipolar transistor (about 0.7 V). The driving voltage of a bipolar transistor as used herein refers to a voltage in the state where the base-emitter voltage is equal to a base-emitter diffusion potential in an active region of the bipolar transistor. To state more specifically, in an NPN bipolar transistor, it is possible to increase the energy gap at the valence bands edges of the emitter layer and the base layer to some extent to suppress injection of holes from the base layer to the emitter layer, and at the same time, reduce the energy gap at the conduction bands edges of the emitter layer and the base layer. In this way, the driving voltage of the transistor can be reduced.

In the HBT, also, it is possible to provide a base region having a gradient composition in which the Ge content gradually increases from the emitter region toward the collector region, so that the band gap of the base region is gradually reduced from the emitter region toward the collector region. Under an electric field generated by this gradient composition, traveling of carriers injected in the base layer is accelerated causing drifting. By this drift electric field, the carriers travel faster in the base region than they travel due to diffusion. This shortens the traveling time in the base region, and thus can improve the cutoff frequency ($f_T$).

However, since the lattice constant of Ge (5.65 Å) is different from the lattice constant of Si (5.43 Å), if the Ge content is large, dislocation is generated due to strain caused by the difference in lattice constant. This deteriorates the electric characteristics. In short, in order to further facilitate low-voltage driving, the Ge content of the SiGe layer must be increased. However, as the Ge content of the SiGe layer is larger, the difference in lattice constant is greater between the SiGe layer and the Si layer. The Ge content therefore has an upper limit. To overcome this problem, attention is paid to the fact that the lattice constant of C crystal is smaller than the lattice constant of Si crystal. That is, SiGeC mixed crystal made of a SiGe layer containing C can reduce the strain due to the difference in lattice constant (L. D. Lanzerotti, A. St. Amour, C. W. Liu, J. C. Strum, J. K. Watanabe and N. D. Theodore, IEEE Electron Device Letters, Vol. 17, No. 7, p.334 (1996)). Therefore, a HBT utilizing heterojunction between a Si layer and a SiGeC layer may be considered. This HBT however has a problem that an impurity contained in the base region diffuses into the collector region during heat treatment, forming a so-called parasitic barrier between the base and the collector (J. W. Slotboom, G. Streutker, A. Pruijmboom and D. J. Gravesteijn, IEEE Electron Device Letters 12, p. 486 (1991)). The formation of a parasitic barrier causes reduction of a gain (β) and deterioration of an early voltage Va and the cutoff frequency $f_T$. To solve this problem, an undoped spacer layer may be interposed between the base and the collector (E. J. Prinz, P. M. Garone, P. V. Schwartz, X. Xiano and J. C. Strum, IEDM Technology Digital, p. 853 (1991)). C has an effect of suppressing impurity diffusion (L. D. Lanzerotti, J. C. Strum, E. Stach, R. Hull, T. Buyuklimanli and C. Magee, Applied Physics Letters 70 (23) p. 3125 (1997)). With this effect, it is expected that the profile of boron as a p-type impurity in the base region can be retained and thus the characteristics such as the early voltage Va and the cutoff frequency $f_T$ can be improved.

However, the conventional SiGeC HBT utilizing SiGeC/Si heterojunction has the following problems.

When it is attempted to further reduce the band gap of the SiGeC layer as the base region of a SiGeC HBT for the purpose of further improving the gain, for example, the Ge content of the SiGeC layer must be further increased. As described above, with increase of the Ge content, lattice strain occurs, and to reduce the lattice strain, the content of C may be increased. However, according to experiments carried out by the present inventors, it has been found that the high-frequency characteristics of a HBT deteriorate when the C content is increased. For example, in a HBT using a SiGeC layer having a C content of 0.8% or more as the base region, the n value of a base current is about 2. Hereinafter, the results of the experiments carried out by the present inventors will be described.

FIGS. 8A and 8B are Gummel plots of a $SiGe_{0.268}$ HBT and a $SiGe_{0.268}C_{0.0091}$ HBT, respectively. FIGS. 9A and 9B are views showing the gains (β) of the $SiGe_{0.268}$ HBT and the $SiGe_{0.268}C_{0.0091}$ HBT, respectively. Note that the expression of "the $SiGe_{0.268}$ HBT", "$SiGe_{0.268}C_{0.0091}$ HBT", and the like as used herein indicates that the mole fraction of Si is a value obtained by subtracting the total content of the other materials (Ge, C, and the like) from 1.

As is found from comparison between FIGS. 8A and 8B, the n value (gradient) of a base current Ib of the $SiGe_{0.268}C_{0.0091}$ HBT is significantly inferior compared with the n value of the base current Ib of the $SiGe_{0.268}$ HBT. Also, as is found from comparison between FIGS. 9A and 9B, the gain β of the $SiGe_{0.268}C_{0.0091}$ HBT is only 50 at maximum, which is inferior compared with the gain β of 400 of the $SiGe_{0.268}$ HBT at maximum. The reason is considered as follows. The n value deteriorates because a recombination current increases as the C content is close to 1% in the SiGeC HBT, and with the deterioration of the n value, the gain β decreases.

FIG. 10 is a view for examining fitting between the measurement results of the forward current-voltage characteristics in the emitter-base diode characteristics of the $SiGe_{0.268}$ HBT and the $SiGe_{0.268}C_{0.0091}$ HBT and the calculation results of the sum of a recombination current and a diffusion current of electrons. In FIG. 10, the calculated results of the sum of the recombination current and the diffusion current of electrons of the diode are fitted with the measurement results using a recombination lifetime (τr) in an emitter-base depletion layer as a parameter. As is found from the results of the diode characteristics, while the recombination lifetime is about 100 nsec in a SiGeC layer having a C content of 0% (that is, SiGe layer), it is about 400 psec in a SiGeC layer having a C content of 0.91%. It is therefore considered that as the C content is close to 1%, the recombination lifetime significantly decreases, which greatly increases the recombination current. As a result, the characteristics deteriorate.

FIGS. 11A and 11B are views showing the results of simulation of the Gummel plot and the gain, respectively, obtained by varying the recombination lifetime in the base region of a $SiGe_{0.268}$ HBT, which includes Ge uniformly, from $1 \times 10^{-5}$ sec to $1 \times 10^{-9}$ sec. As is found from FIG. 11A, as the recombination lifetime is shorter, the recombination current of the base current greatly increases, causing deterioration of the n value, while the collector current is not influenced so much. As is found from FIG. 11B, since the recombination current of the base current increases as the recombination lifetime is shorter as described above, the gain β significantly decreases. That is, a short recombination lifetime causes deterioration of the transistor characteristics.

One reason why the recombination lifetime is shortened when the C content of the SiGeC HBT is large is that in SiGeC crystal having a high C content, the amount of C existing at interstitial positions of the crystal is large. The C existing at interstitial positions constitutes a recombination level, and this increases the recombination current.

SUMMARY OF THE INVENTION

An object of the present invention is providing a heterojunction bipolar transistor in which the emitter-base recombination current is reduced, low-voltage driving is attained, and the high-frequency characteristics are improved.

A heterojunction bipolar transistor of the present invention includes: a first-conductivity type collector region made of a semiconductor material including Si formed on a substrate; a second-conductivity type base region made of a $Si_{1-x-y}Ge_xC_y$ layer (0<x<1, 0≦y<1) having a nonuniform C content formed on the collector region; and a first-conductivity type emitter region made of a semiconductor material including Si formed on the base region, the emitter region forming heterojunction with the base region. In the base region, a portion having the largest C content is separated from a portion adjacent to the emitter region.

With the above construction, the C content is comparatively low in the portion of the base region adjacent to the emitter region. Therefore, in the depletion layer at the emitter-base junction, the region having a high C content is small, and thus the number of recombination centers in the depletion layer can be reduced. This suppresses the recombination current caused by the existence of recombination centers in the depletion layer. That is, by using the base region made of a SiGeC layer for the heterojunction, it is possible to improve the electric characteristics such as the gain and the high-frequency characteristics, in addition to attaining low-voltage driving.

The C content of the portion of the base region adjacent to the emitter region is preferably less than 0.8%.

The C content of the portion of the base region adjacent to the emitter region may be 0.01% or more. This enables minute adjustment of the band structure of the base region.

The heterojunction bipolar transistor is preferably constructed so that the depletion layer formed at the emitter-base junction is within a region in contact with the emitter region in the base region. This enables more effective suppression of the recombination current.

If the Ge content of the region in contact with the emitter region in the base region is constant, the diffusion potential of the emitter-base junction is almost constant even with fluctuation of the depth of the diffusion layer. As a result, the operation voltage can be kept almost constant.

At least the center of a portion of the base region other than the portion adjacent to the emitter region preferably has a uniform Ge content. This facilitates the epitaxial growth of the base region in the fabrication process.

The thickness of the portion of the base region adjacent to the emitter region is preferably 5 nm or more, more preferably 10 nm or more.

A portion of the base region other than the portion adjacent to the emitter region is preferably constructed so that the band gap decreases as the position in the base region is farther from the emitter region and closer to the collector region. This accelerates traveling of carriers in the base region and thus improves the high-frequency characteristics.

A portion of the base region other than the portion adjacent to the emitter region preferably has a composition of which the C content increases as the position in the base region is farther from the emitter region and closer to the collector region. With this construction, the portion having a high C content that has many recombination centers is located at the farthest possible position from the emitter-base junction, to suppress the recombination current and thus attain a low driving voltage.

The base region may be divided into a first base region including the portion adjacent to the collector region and a second base region including the portion adjacent to the emitter region, and the band gap of at least the boundary portion of the first base region on the side of the second base region is equal to or smaller than the band gap of the second base region. With this construction, a significantly low driving voltage is attained.

In the above case, a relationship Δx≧4.288Δy is preferably established where Δx denotes the difference in Ge content between at least a boundary portion of the first base region on the side of the second base region and the second base region, and Δy denotes the difference in C content between at least the boundary portion of the first base region on the side of the second base region and the second base region.

A portion of the first base region other than the boundary portion on the side of the second base region may be constructed so that the band gap decreases as the position in the first base region is farther from the second base region and closer to the collector region. This increases the traveling velocity of carriers in the base region and thus improves the high-frequency characteristics as described above.

In the above case, a relationship Δx≧4.288Δy is preferably established where Δx denotes the difference in Ge content between at least a boundary portion of the first base region on the side of the second base region and the second base region, and Δy denotes the difference in C content between at least the boundary portion of the first base region on the side of the second base region and the second base region.

BRIEF DESCRIPTION OF THE DRAWINGS

FIGS. 7A and 7B are a view showing the C and Ge contents and the boron concentration and an energy band diagram during voltage application, respectively, of a HBT of Embodiment 5 of the present invention.

DESCRIPTION OF THE PREFERRED EMBODIMENTS

Prior to description of specific embodiments of the present invention, basic advantages of a heterojunction bipolar transistor (HBT) of which the base layer is constructed of a SiGeC layer made of a ternary mixed crystal semiconductor including Si, Ge, and C will be described.

Figure 1:
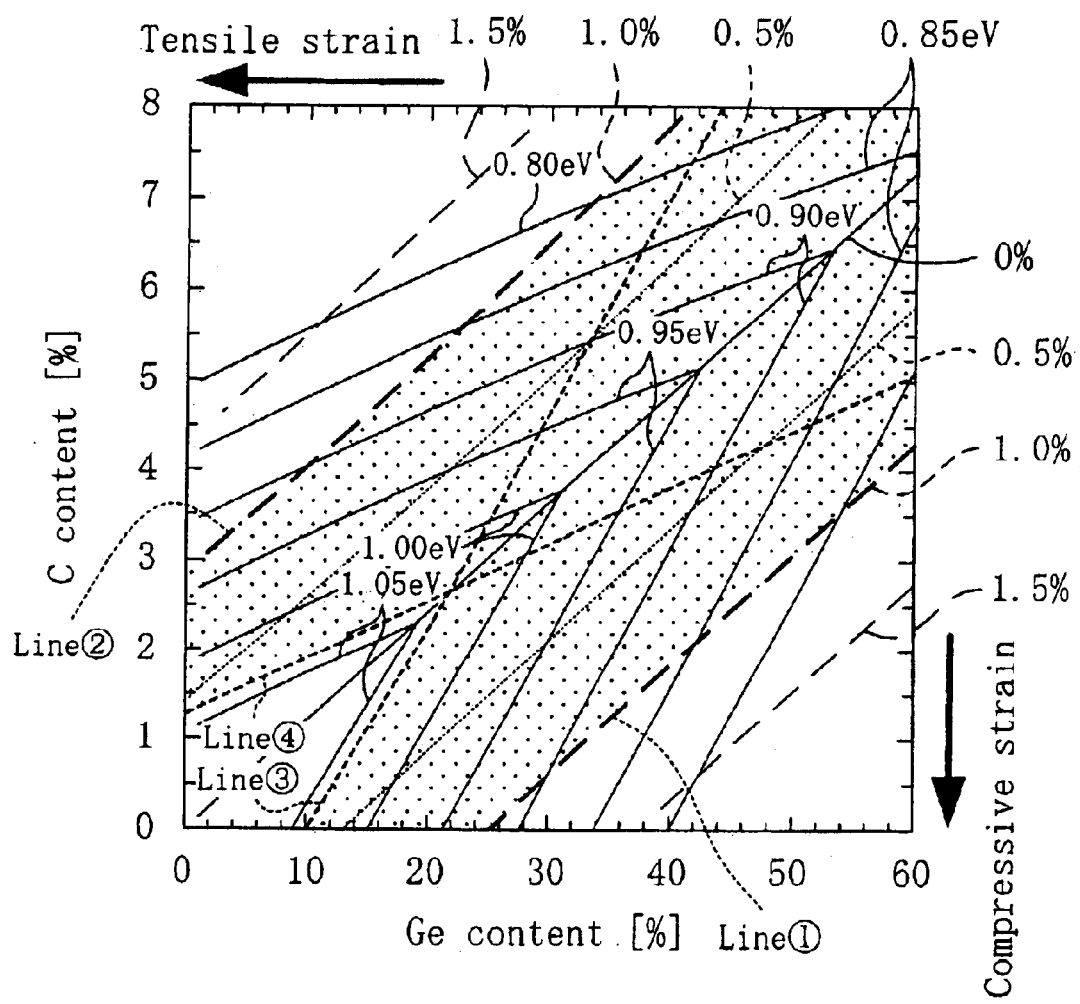
FIG. 1 is a state diagram showing the relationships among the Ge and C contents, the band gap, and the lattice strain in a SiGeC ternary mixed crystal semiconductor.

FIG. 1 is a state diagram showing the relationships among the Ge and C contents, the band gap, and the lattice strain in a SiGeC ternary mixed crystal semiconductor. In FIG. 1, the x-axis represents the Ge content and the y-axis represents the C content. Each of the straight lines represents the composition conditions of the semiconductor under which the strain amount (including compressive strain and tensile strain) or the band gap is constant. In FIG. 1, the dot-hatched area represents an area in which the lattice strain amount of a SiGeC layer formed on a Si layer is 1.0% or less and the band gap thereof is smaller than that of the conventional practical SiGe layer (Ge content: about 10%). This area is defined as an area surrounded by the following four straight lines:

Line 1: y=0.122x−0.032
Line 2: y=0.1245x+0.028
Line 3: y=0.2332x−0.0233 (Ge content: 22% or less)
Line 4: y=0.0622x+0.0127 (Ge content: 22% or less)

where x denotes the Ge content and y denotes the C content in the SiGeC layer represented by $Si_{1-x-y}Ge_xC_y$. Note that a SiGeC layer having a composition somewhere on the straight line representing the lattice strain of 0% in FIG. 1 lattice-matches with the underlying Si layer.

Accordingly, in a HBT composed of an emitter layer, a base layer, and a collector layer, the base layer may be constructed of SiGeC having a composition falling within the dot-hatched area in FIG. 1. By this construction, a narrow band gap base can be attained without causing troubles due to lattice strain.

In other words, by selecting a SiGeC ternary mixed crystal semiconductor material, which is small in band gap and small in lattice strain amount, as the base layer, it is possible to provide a HBT with high reliability capable of realizing low-voltage operation and high-speed operation.

FIG. 1 shows the state of the HBT in which the layer underlying the SiGeC layer is made of Si only. Alternatively, the Si underlying layer may include Ge and C to some extent as long as the lattice strain of the SiGeC layer is 1.0% or less and a large difference in band gap is secured between the underlying layer and the SiGeC layer. In this case, also, substantially the same effect can be obtained.

Figure 2:
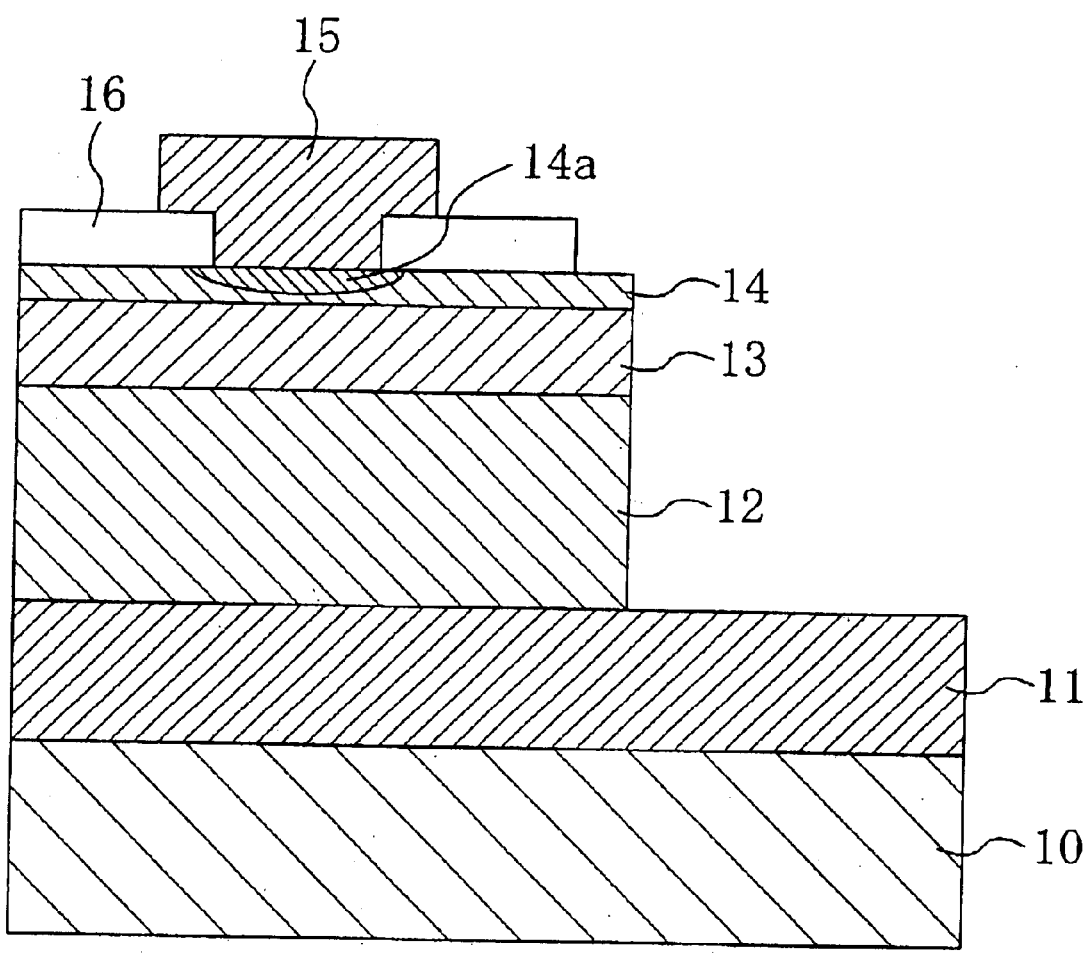
FIG. 2 is a cross-sectional view of a heterojunction bipolar transistor (HBT) common to embodiments of the present inventions.

FIG. 2 is a cross-sectional view of a HBT common to embodiments of the present invention. As shown in FIG. 2, the HBT of the present invention includes: a Si substrate 10 including a p-type impurity; a Si collector buried layer 11 formed by implanting an n-type impurity (for example, phosphorus) in the Si substrate 10; a first base region 12 made of a SiGeC layer having a high C content formed on the Si collector buried layer 11; a second base region 13 made of a SiGeC layer having a low C content or a SiGe layer formed on the first base region 12; a Si cap layer 14 formed on the second base region 13; and an emitter electrode 15 made of a polysilicon film formed on the Si cap payer 14.

A method for fabricating the HBT with the above construction will be described. First, phosphorous (P) as the n-type impurity is implanted in the surface portion of the Si substrate 10 by ion implantation or the like in a concentration of about $2\times10^{17}/cm^3$, to form the collector buried layer 11. On the collector buried layer 11, sequentially grown by epitaxy by UHV-CVD or the like are: the first base region 12 made of a SiGeC layer having a high C content; and the second base region 13 made of a SiGeC layer having a C content lower than the first base region 12 or a SiGe layer. The C content of at least the boundary portion of the second base region 13 on the side of the emitter region (on the side of the Si cap layer) should be less than 0.8%. As the source gas for the epitaxy, silane and disilane are used for the material of Si, germane is used for the material of Ge, and methylsilane and methylgermane are used for the material of C. Boron (B) as a p-type impurity, for example, is doped in the first and second base regions 12 and 13 in a concentration of about $4\times10^{18}/cm^3$. The thickness of the first base region 12 is about 35 nm, and the thickness of the second base region 13 is about 25 nm (total thickness: about 60 nm).

Thereafter, the Si cap layer 14 made of a Si layer is epitaxially grown on the second base region 13. The Si cap layer 14 is not doped with any impurity and has a thickness of about 10 nm. A silicon oxide film 16 having an opening is formed on the Si cap layer 14. The emitter electrode 15, made of an $n^+$-type polysilicon film containing an n-type impurity such as arsenic (As) and phosphorus (P), is formed over the opening and part of the silicon oxide film 16. The emitter electrode 15 has been doped with arsenic (or phosphorus) in a high concentration of about $1 \times 10^{20}/cm^3$. This n-type impurity is diffused into the Si cap layer 14 by heat treatment, to form an emitter region 14a in the Si cap layer 14.

Figure 8A:
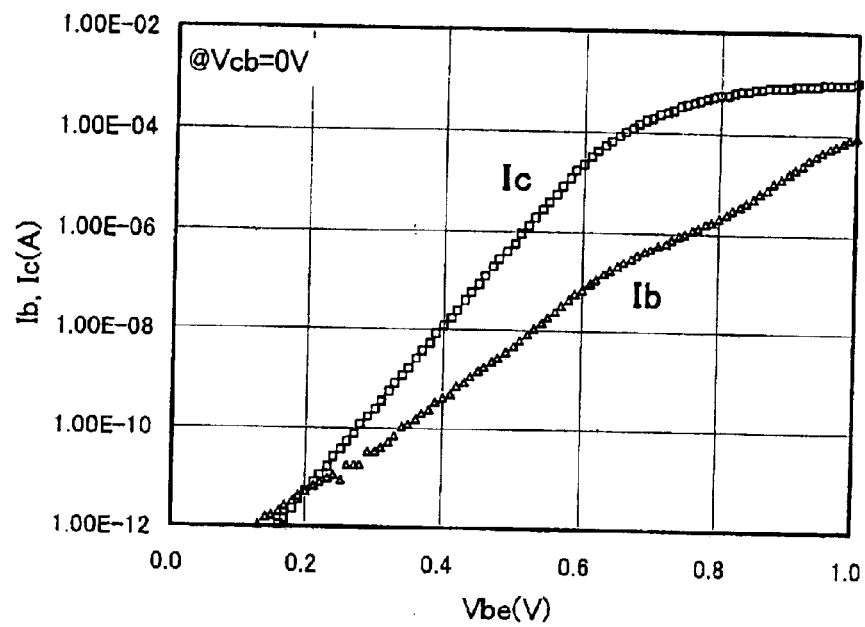
FIGS. 8A and 8B are Gummel plots of a $SiGe_{0.268}$ HBT and a $SiGe_{0.268}C_{0.0091}$ HBT, respectively.
Figure 8B:
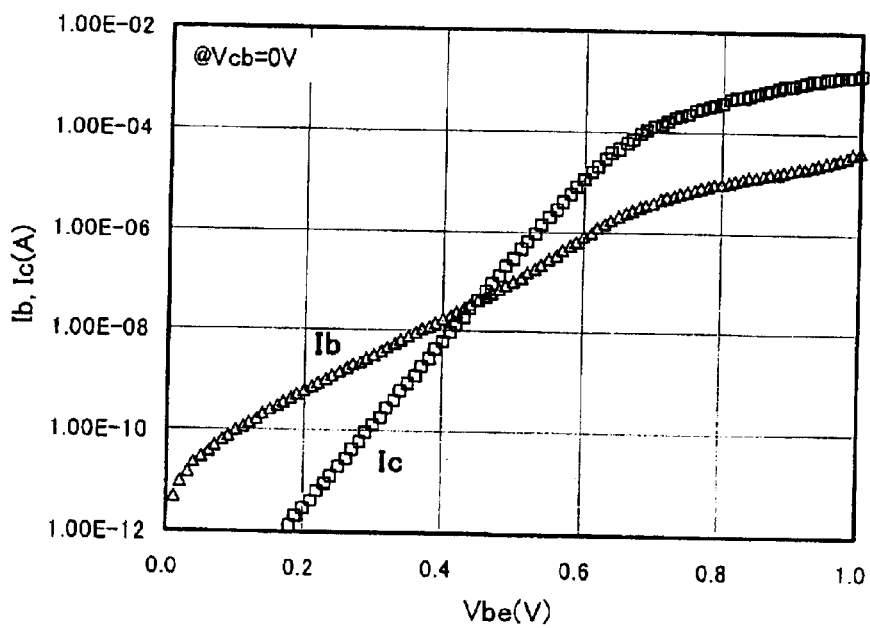
Figure 9A:
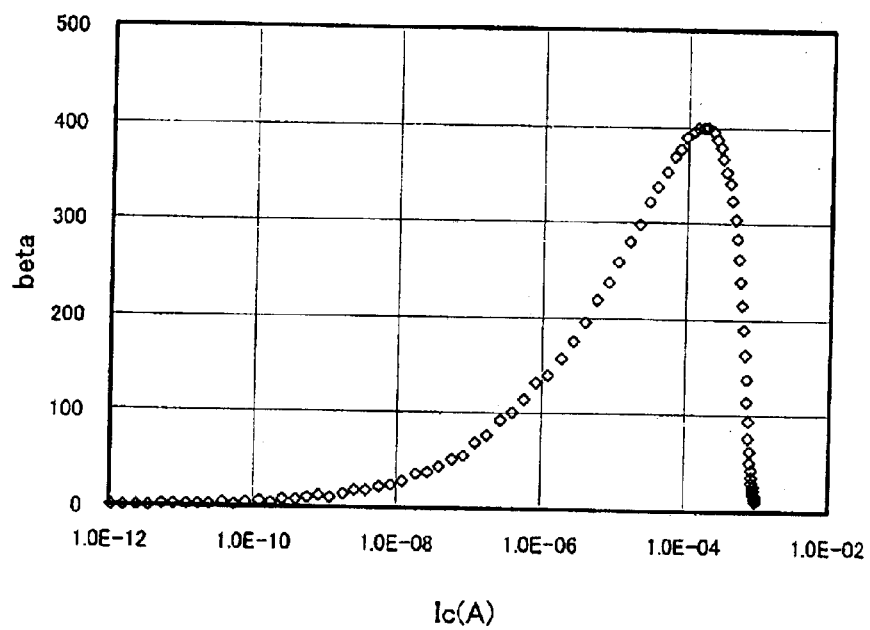
FIGS. 9A and 9B are views showing the gains (β) of the $SiGe_{0.268}$ HBT and the $SiGe_{0.268}C_{0.0091}$ HBT, respectively.
Figure 9B:
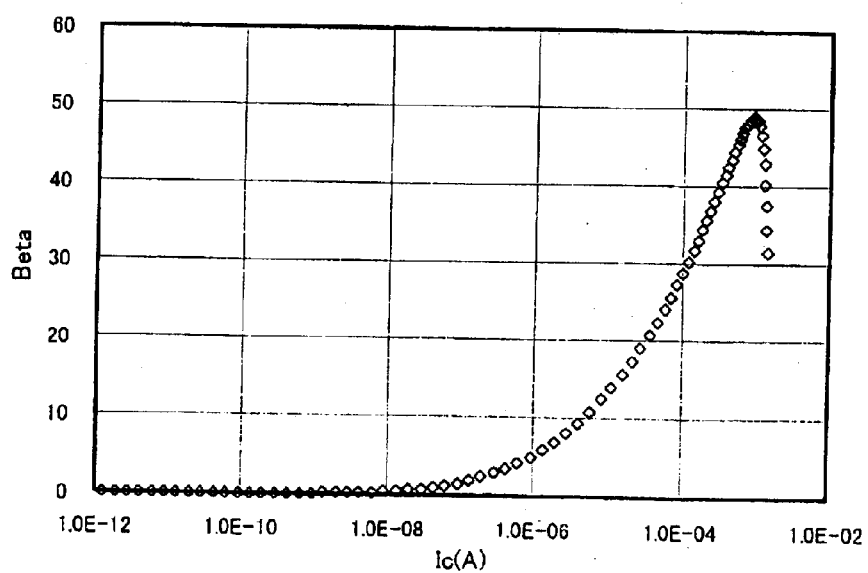
Figure 10:
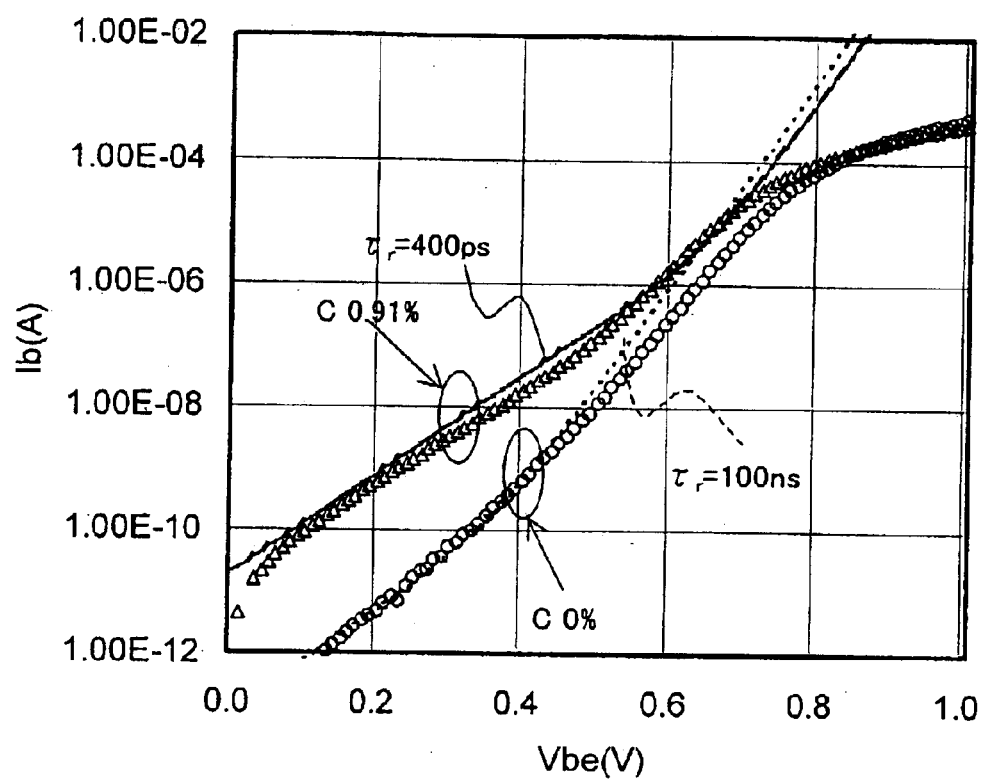
FIG. 10 is a view for examining fitting between the measurement results of the forward current-voltage characteristics in the emitter-base diode characteristics of the $SiGe_{0.268}$ HBT and the $SiGe_{0.268}C_{0.0091}$ HBT and the calculation results of the sum of a recombination current and a diffusion current of electrons.
Figure 11A:
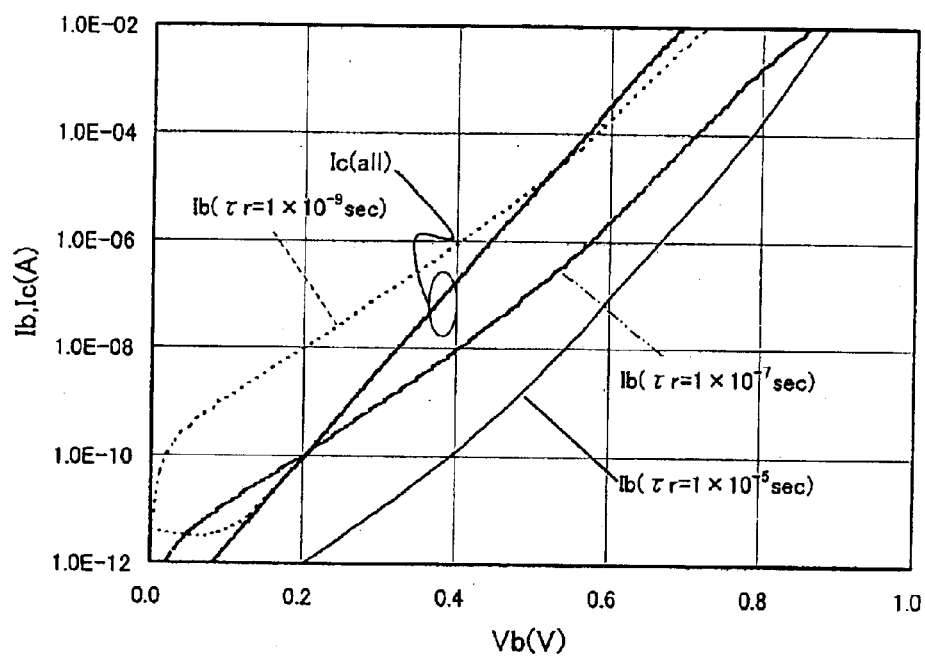
FIGS. 11A and 11B are views showing the results of simulation of the Gummel plot and the gain, respectively, obtained by varying the recombination lifetime in the base region of a $SiGe_{0.268}$ HBT including Ge uniformly.
Figure 11B:
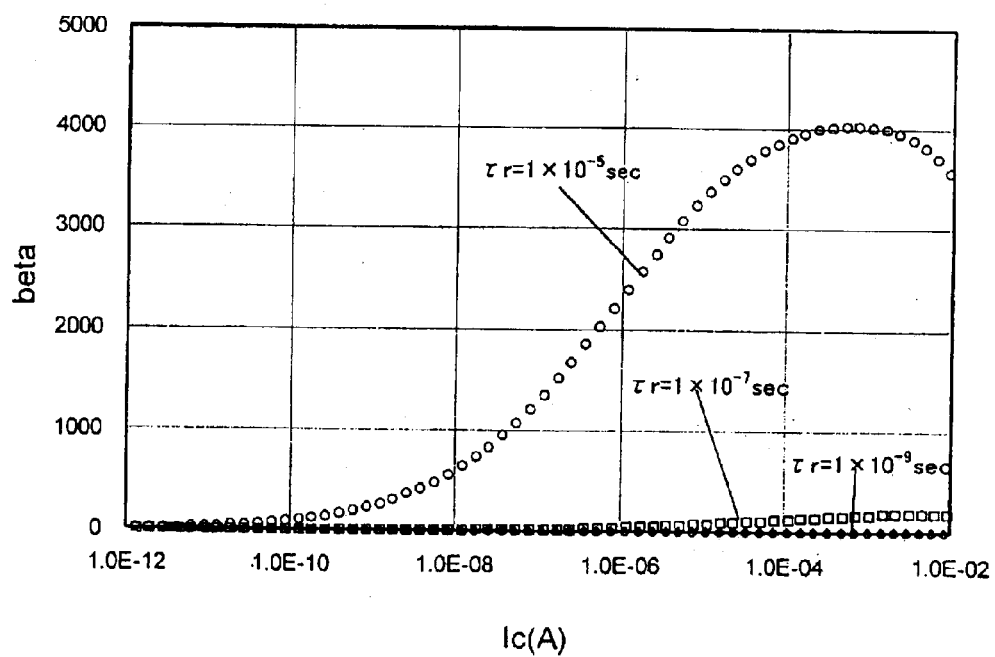

Thus, according to the HBT described above, the second base region 13 having a low C content is interposed between the first base region 12 having a high C content and the emitter region 14a. In particular, the C content of the boundary portion of the second base region 13 on the side of the emitter region (emitter-side boundary portion) is made as small as less than 0.8%, so that recombination centers generated due to the high C content of the first base region 12 are kept from the emitter-base depletion layer. With this construction, therefore, it is possible to improve the n value of a base current and reduce a leak current, and thus the problems described with reference to FIGS. 8B and 9B can be suppressed. In addition, with the existence of the first base region 12 having a high C content, it is possible to attain low-voltage driving while suppressing generation of lattice strain, as in the case of the conventional HBT utilizing Si/SiGeC heterojunction. These are the basic advantages of the present invention.

In FIG. 2, the base region has been conveniently divided into the first base region 12 and the second base region 13. The present invention is also applicable to a HBT including a base region that cannot be divided into first and second base regions. For example, in $Si_{1-x-y}Ge_xC_y$ constituting the base layer, the mole fractions may continuously change over the entire base layer. The basic advantages of the present invention described above are obtainable as long as the C content of the portion of the base region adjacent to the emitter region is smaller than the C content of the portion of the base region adjacent to the collector region.

Embodiment 1

Figure 3A:
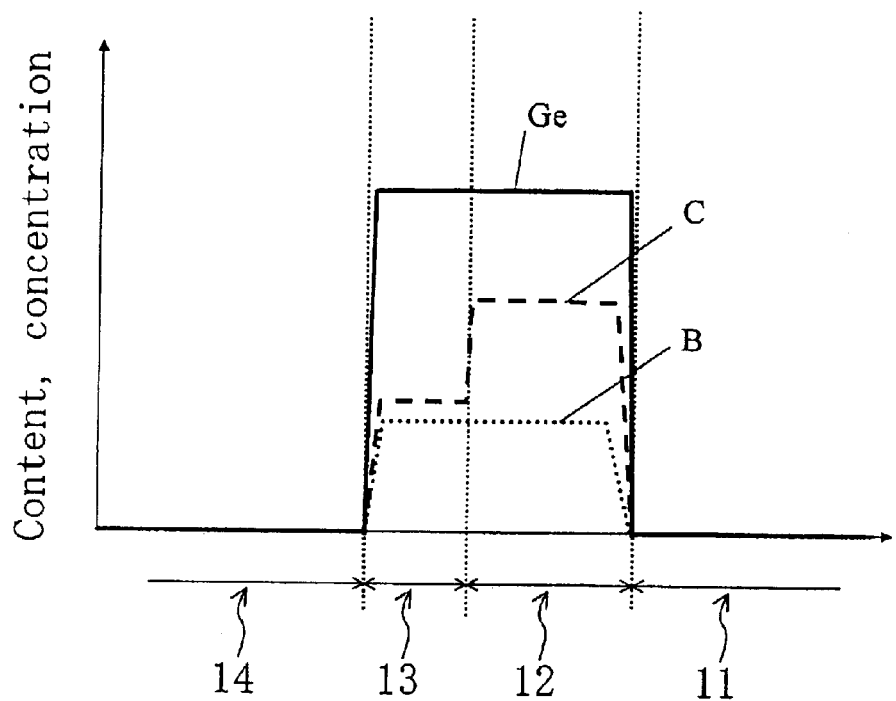
FIGS. 3A and 3B are a view showing the C and Ge contents and the boron concentration and an energy band diagram during voltage application, respectively, of a HBT of Embodiment 1 of the present invention.
Figure 3B:
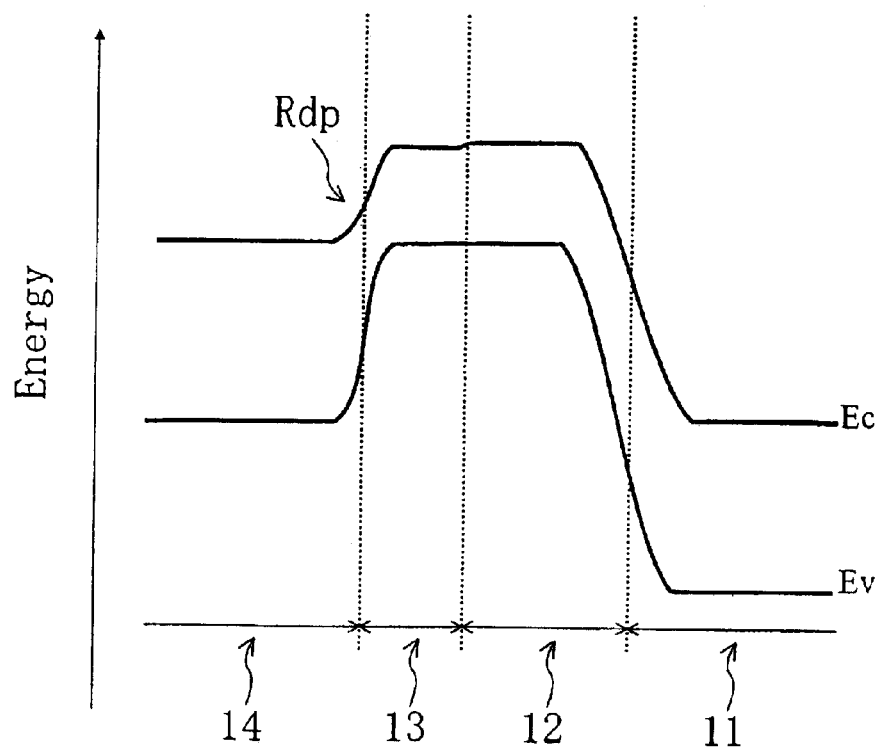

FIG. 3A is a view showing the C content, the Ge content, and the concentration of boron (B) as an impurity, of the first and second base regions in Embodiment 1. FIG. 3B is an energy band diagram over the emitter region—base region—collector region during voltage application in Embodiment 1. Note that in FIG. 3A, representation of the concentration of an n-type impurity is omitted.

As shown in FIG. 3A, in this embodiment, the Ge content is constant (for example, 26.8%) throughout the first base region 12 and the second base region 13. The C content is 0.91% in the first base region 12 and 0.35% in the second base region 13, for example. In this case, therefore, the first base region 12 is made of a $SiGe_{0.268}C_{0.0091}$ layer, while the second base region 13 is made of a $SiGe_{0.268}C_{0.0035}$ layer.

The band gap of the $SiGe_{0.268}C_{0.0091}$ layer is about 0.95 eV, while the band gap of the $SiGe_{0.268}C_{0.0035}$ layer is about 0.92 eV. When two SiGeC layers having the same Ge content are layered one upon the other as in this case, the band gap of the layer having a higher C content is larger than that of the other layer. Therefore, as shown in FIG. 3B, by interposing the SiGeC layer having a low C content (second base region 13) between the emitter region 14a and the first base region 12 having a high C content, a barrier tends to less occur at the emitter-base junction. The existence of the second base region 13 having a low C content is therefore free from exerting adverse influence such as increasing the driving voltage of the HBT. In addition, as described above, by interposing the second base region 13 having a low C content between the emitter region 14a and the first base region 12 having a high C content, the recombination current in the emitter-base depletion layer (region Rdp shown in FIG. 3B) can be reduced. That is, the HBT of this embodiment can suppress deterioration of the n value and reduction of the gain caused by increase of the recombination current, and yet can attain further low-voltage driving.

Note that the effect of reducing the recombination current in the depletion layer formed at the emitter-base junction can be obtained even in the cases that the base layer is not dividable into two base regions having a definite boundary therebetween and that the base layer is dividable into three or more regions, for example, in the case that the mole fractions of $Si_{1-x-y}Ge_xC_y$ constituting the base layer continuously change over the entire base layer, as long as the C content of the portion of the base layer adjacent to the emitter layer is sufficiently small.

Experiment Data in Embodiment 1

Figures 12, 13:
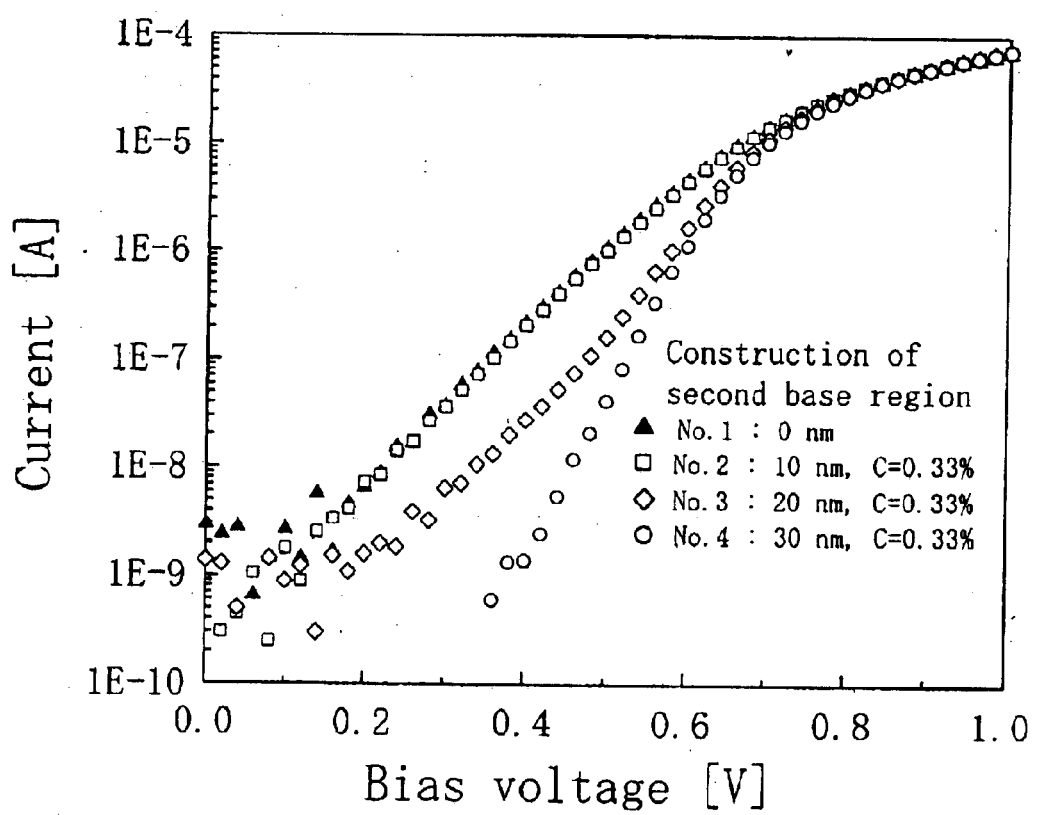
FIG. 12 is a view, shown in the form of a table, of parameters of samples used for experiments for confirmation of the effects of the present invention.
FIG. 13 is a view showing data of bias voltage-current characteristics measured for the samples shown in FIG. 12.

FIG. 12 is a view, shown in the form of a table, of parameters of samples used for experiments for confirmation of the effects of the present invention. In FIG. 12, S denotes the thickness of the Si cap layer 14, D1 denotes the thickness of the first base region 12, D2 denotes the thickness of the second base region 13. $N_{G1}$, $N_{C1}$, and $N_{B1}$ respectively denote the Ge content, the C content, and the boron concentration of the first base region 12. $N_{G2}$, $N_{C2}$, and $N_{B2}$ respectively denote the Ge content, the C content, and the boron concentration of the second base region 13.

FIG. 13 is a view showing data of bias voltage-current characteristics measured for the samples shown in FIG. 12. As is found from FIG. 13, in sample No. 1 that does not include a layer having a low C content (second base region), the gradient of the voltage-current characteristics is slow, indicating that the recombination current is large. In sample No. 2 in which the thickness of the second base region 13 having a low C content is 10 nm, the gradient of the voltage-current characteristics is somewhat raised, exhibiting the effect of reducing the recombination current to some extent although it is still small. In sample No. 3 in which the thickness of the second base region 13 having a low C content is 20 nm, the gradient of the voltage-current characteristics is a little sharp, clearly exhibiting the effect of reducing the recombination current. In sample No. 4 in which the thickness of the second base region 13 having a low C content is 30 nm, the gradient of the voltage-current characteristics is sharp, markedly exhibiting the effect of reducing the recombination current.

In the samples used for the above experiments, the concentration of the impurity (boron) in the first and second base regions 12 and 13 is $2 \times 10^{18}/cm^{-3}$, which is considerably low compared with the impurity concentration of a base region of a normal HBT of $1 \times 10^{19}/cm^{-3}$. It is therefore presumed that under this condition the depletion layer at the emitter-base junction must have expanded. In other words, if the impurity concentration of the base region is set at about $1 \times 10^{19}/cm^{-3}$, the expansion of the depletion layer at the emitter-base junction will be narrower than that in the samples used in the experiments. In view of this point, the effect of reducing the recombination current will be obtained when the thickness of the second base region 13 is about 5 nm or more.

Embodiment 2

Figure 4A:
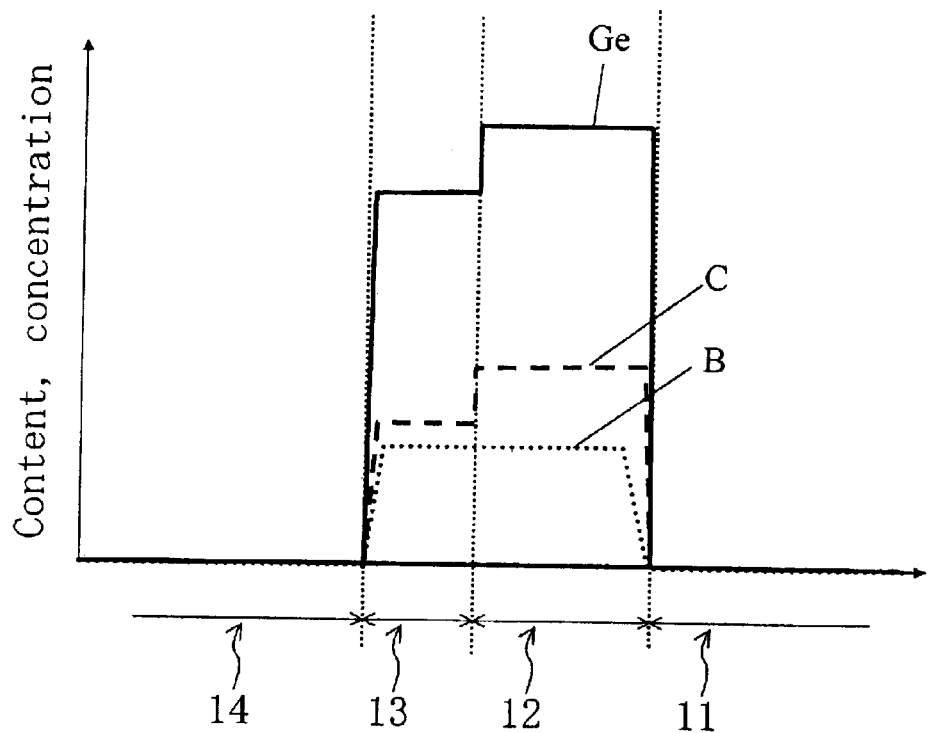
FIGS. 4A and 4B are a view showing the C and Ge contents and the boron concentration and an energy band diagram during voltage application, respectively, of a HBT of Embodiment 2 of the present invention.
Figure 4B:
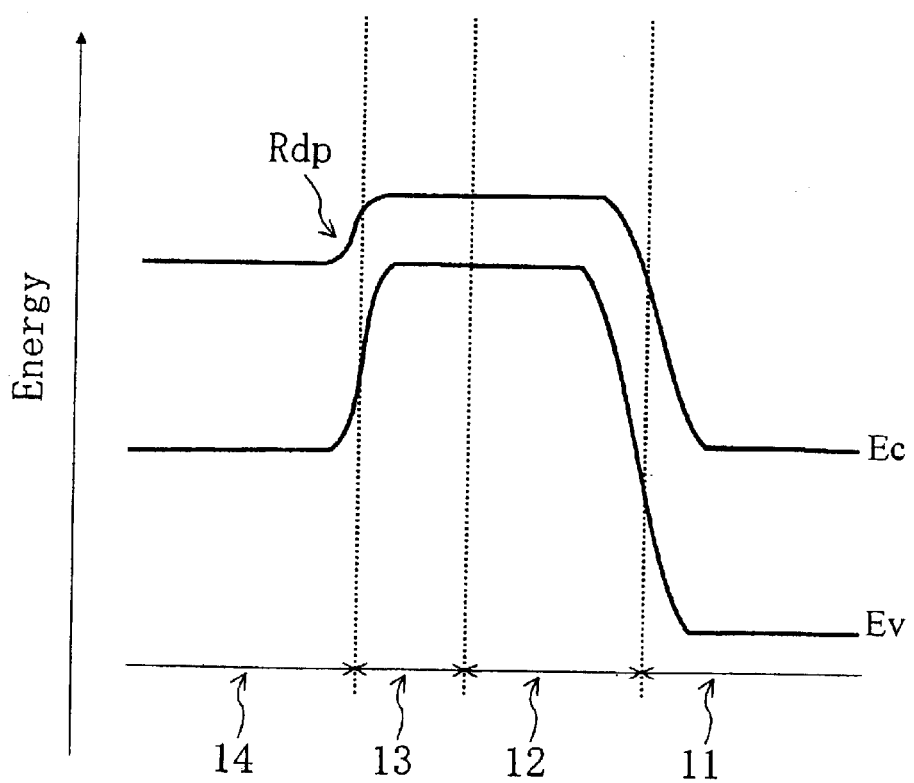

FIG. 4A is a view showing the C content, the Ge content, and the concentration of boron (B) as an impurity, of the first and second base regions in Embodiment 2. FIG. 4B is an energy band diagram over the emitter region - base region collector region during voltage application in Embodiment 2. Note that in FIG. 4A, representation of the concentration of an n-type impurity is omitted.

In this embodiment, the Ge and C contents of the first and second base regions 12 and 13 have been adjusted so that the band gaps of the two base regions are equal to each other. To attain this, the Ge content is not made constant throughout the first and second base regions, but the Ge content of the first base region 12 should be larger than that of the second base region 13. Specifically, when the SiGeC layer is represented by general formula $Si_{1-x-y}Ge_xC_y$, and the difference of the C content between the first and second base regions 12 and 13 is denoted by $\Delta y$, the difference $\Delta x$ of the Ge content between the first and second base regions 12 and 13 is determined based on equation (1) below.

$$\Delta x \geq 4.288 \Delta y \qquad (1)$$

Note that both the first and second base regions 12 and 13 have compositions that receive compressive strain with respect to the Si layer.

As shown in FIG. 4A, the Ge content of the first base region 12 is fixed at a higher value (for example, 31.3%), and the Ge content of the second base region 13 is fixed at a lower value (for example, 26.8%). The C content is set at 1.4% for the first base region 12 and 0.35% for the second base region 13, for example. In this case, therefore, the first base region 12 is made of a $SiGe_{0.313}C_{0.014}$ layer, while the second base region 13 is made of a $SiGe_{0.268}C_{0.0035}$ layer.

The band gap of the $SiGe_{0.313}C_{0.014}$ layer is about 0.92 eV, and the band gap of the $SiGe_{0.268}C_{0.0035}$ layer is also about 0.92 eV. Thus, as shown in FIG. 4B, the conduction bands edges of the two base regions 12 and 13 are in line with each other. With this construction, where two SiGeC layers having the same band gap are layered one upon the other, further low-voltage driving is attained. In addition, as described above, by interposing the second base region 13 having a low C content between the emitter region 14a and the first base region 12, the recombination current in the emitter-base depletion layer (region Rdp shown in FIG. 4B) can be reduced.

In addition, when $\Delta x \geq 4.288 \Delta y$, the bandgap of the first base region 12 becomes equal to or smaller than that of the second base region 13 so that no hetrojunction barrier which inhibits running of carries exists. Thus, high seed operation of the heterojunction bipolar transistor is attained.

That is, the HBT of this embodiment can suppress deterioration of the n value and reduction of the gain caused by increase of the recombination current, and at the same time, especially significant low-voltage driving is attained.

Embodiment 3

Figure 5A:
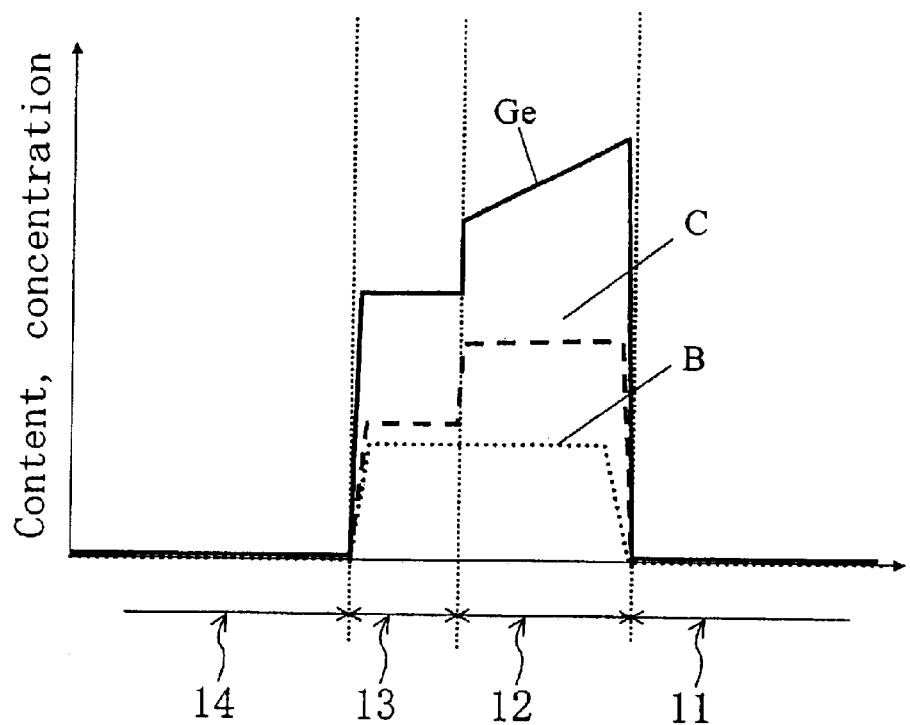
FIGS. 5A and 5B are a view showing the C and Ge contents and the boron concentration and an energy band diagram during voltage application, respectively, of a HBT of Embodiment 3 of the present invention.
Figure 5B:
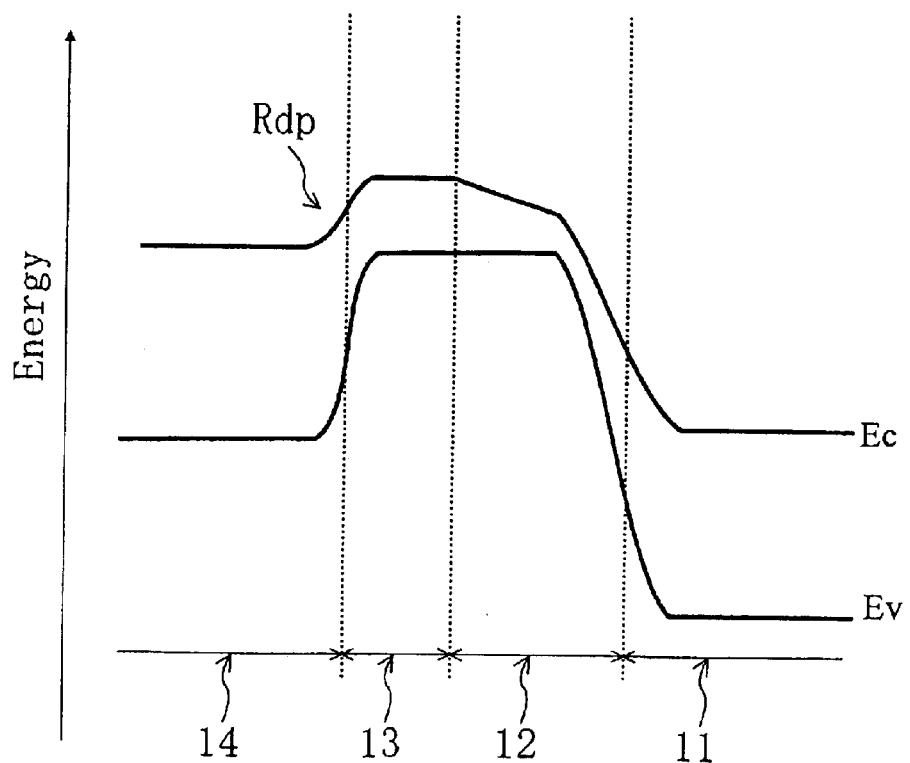

FIG. 5A is a view showing the C content, the Ge content, and the concentration of boron (B) as an impurity, of the first and second base regions in Embodiment 3. FIG. 5B is an energy band diagram over the emitter region—base region—collector region during voltage application in Embodiment 3. Note that in FIG. 5A, representation of the concentration of an n-type impurity is omitted.

In this embodiment, the Ge and C contents of the first and second base regions 12 and 13 have been adjusted so that the band gaps of the first base region 12 and the second base region 13 at the boundary of these base regions are equal to each other and the band gap of the first base region 12 changes in a direction in which electrons traveling in the base region are accelerated. To attain this, when the SiGeC layer is represented by general formula $Si_{1-x-y}Ge_xC_y$ and the difference of the C content between the first and second base regions 12 and 13 is denoted by $\Delta y$, the difference $\Delta x$ of the Ge content between the boundary portion of the first base region 12 on the side of the second base region (second base-side boundary portion) and the second base region 13 is determined based on equation (1) above. In this case, the Ge content of the first base region 12 is increased as the position in the first base region 12 is farther from the second-base side boundary portion and closer to the collector buried layer 11.

As shown in FIG. 5A, in this embodiment, the Ge content of the second base-side boundary portion of the first base region 12 is set at a higher value (for example, 20.0%), and the Ge content of the boundary portion of the first base region 12 on the side of the collector buried layer (collector-side boundary portion) is set at a still higher value (for example, 30%). The Ge content of the second base region 13 is fixed at a lower value (for example, 15.2%). The C content is set at a higher fixed value (for example, 1.4%) for the first base region 12 and at a lower fixed value (for example, 0.3%) for the second base region 13. In this case, therefore, the second base-side boundary portion of the first base region 12 is made of a $SiGe_{0.20}C_{0.014}$ layer, the collector-side boundary portion of the first base region 12 is made of a $SiGe_{0.30}C_{0.014}$ layer, while the second base region 13 is made of a $SiGe_{0.152}C_{0.003}$ layer.

The band gap of the $SiGe_{0.20}C_{0.014}$ layer is about 1.02 eV, and the band gap of the $SiGe_{0.152}C_{0.003}$ layer is also about 1.02 eV. Thus, as shown in FIG. 5B, the band gaps of the two base regions 12 and 13 at the boundary thereof are equal to each other. The band gap of the collector-side boundary portion of the first base region 12 is about 0.93 eV. Therefore, since the band gap of the first base region 12 gradually decreases from the second base-side boundary portion thereof toward the collector buried layer 11, electrons in the first base region 12 are accelerated by a drift electric field. This shortens the traveling time of the electrons and thereby improves the high-frequency characteristics of the HBT. In addition, with the construction where two SiGeC layers having the same band gap at the boundary thereof are layered one upon the other, further low-voltage driving is attained as in Embodiment 2. In addition, as described above, by interposing the second base region 13 having a low C content between the emitter region 14a and the first base region 12, the recombination current in the emitter-base depletion layer (region Rdp shown in FIG. 5B) can be reduced.

That is, in this embodiment, in addition to the effects attained in Embodiment 2, it is possible to improve the high-frequency characteristics of the HBT.

Embodiment 4

Figure 6A:
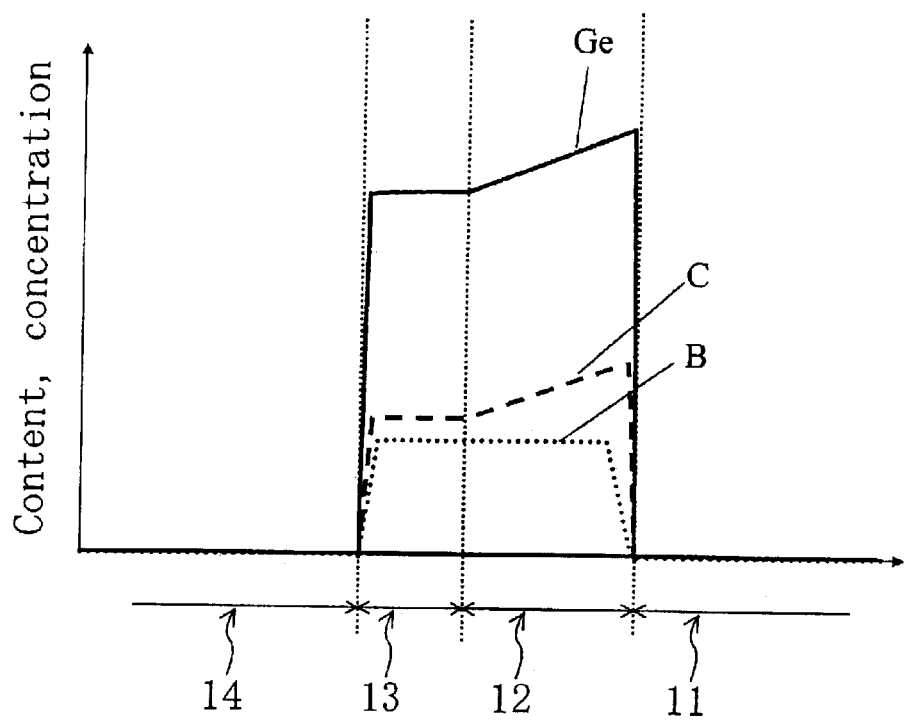
FIGS. 6A and 6B are a view showing the C and Ge contents and the boron concentration and an energy band diagram during voltage application, respectively, of a HBT of Embodiment 4 of the present invention.
Figure 6B:
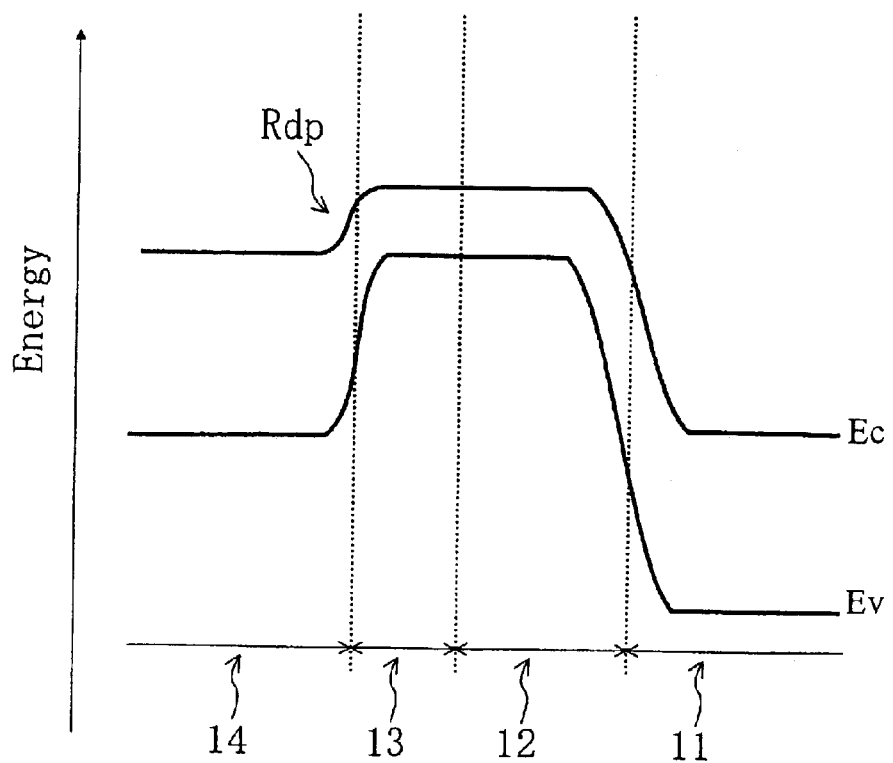

FIG. 6A is a view showing the C content, the Ge content, and the concentration of boron (B) as an impurity, of the first and second base regions in Embodiment 4. FIG. 6B is an energy band diagram over the emitter region—base region—collector region during voltage application in Embodiment 4. Note that in FIG. 6A, representation of the concentration of an n-type impurity is omitted.

In this embodiment, the Ge and C contents of the first and second base regions 12 and 13 have been adjusted so that the band gaps of the two base regions are equal to each other and lattice strain at the boundary of the first and second base regions 12 and 13 is as small as possible. To attain this, the Ge and C contents at the second base-side boundary portion of the first base region 12 are made equal to those of the second base region 13. And, the Ge and C contents of the first base region 12 are increased as the position in the first base region 12 is farther from the second base-side boundary portion and closer to the collector buried layer 11. In this case, when the SiGeC layer is represented by general formula $Si_{1-x-y}Ge_xC_y$, and the difference of the C content between the portion of the first base region 12 excluding the second base-side boundary portion and the second base region 13 is denoted by $\Delta y$, the difference $\Delta x$ of the Ge content between the portion of the first base region 12 excluding the second base-side boundary portion and the second base region 13 is determined based on equation (1) above.

As shown in FIG. 6A, in this embodiment, the Ge content of the second base region 13 and the Ge content of the second base-side boundary portion of the first base region 12 are set at a common value (for example, 26.8%), while the Ge content of the collector-side boundary portion of the first base region 12 is set at a higher value (for example, 31.3%). The C content is set at a common value (for, example, 0.35%) for the second base region 13 and the second base-side boundary portion of the first base region 12, and at a higher value (for example, 1.4%) for the collector-side boundary portion of the first base region 12. In this case, therefore, the second base region 13 and the second base-side boundary portion of the first base region 12 are made of a $SiGe_{0.268}C_{0.0035}$ layer, while the collector-side boundary portion of the first base region 12 is made of a $SiGe_{0.313}C_{0.014}$ layer.

The band gap of the $SiGe_{0.268}C_{0.0035}$ layer is about 0.93 eV, and the band gap of the $SiGe_{0.313}C_{0.014}$ layer is also about 0.93 eV. Thus, as shown in FIG. 6B, the band gaps of the two base regions 12 and 13 are equal to each other. In addition, since both the Ge and C contents of the first and second base regions 12 and 13 are the same at the boundary thereof, abrupt change in lattice constant is avoided at the boundary. Therefore, lattice strain of the entire base region can be minimized, and thus defects such as dislocation due to lattice strain are suppressed. This contributes to improvement of the electric characteristics of the HBT.

With the above construction, where two SiGeC layers having the same band gap are layered one upon the other, further low-voltage driving is attained, as in Embodiment 2. In addition, as described above, by interposing the second base region 13 having a low C content between the emitter region 14a and the first base region 12, the recombination current in the emitter-base depletion layer (region Rdp shown in FIG. 6B) can be reduced.

That is, in this embodiment, in addition to the effects attained in Embodiment 2, it is possible to improve the electric characteristics of the HBT by suppressing generation of defects.

Embodiment 5

FIG. 7A is a view showing the C content, the Ge content, and the concentration of boron (B) as an impurity, of the first and second base regions in Embodiment 5. FIG. 7B is an energy band diagram over the emitter region—base region—collector region during voltage application in Embodiment 5. Note that in FIG. 7A, representation of the concentration of an n-type impurity is omitted.

In this embodiment, the Ge and C contents of the first and second base regions 12 and 13 have been adjusted so that the band gaps of the first base region 12 and the second base region 13 at the boundary of these base regions are equal to each other, the band gap of the first base region 12 changes in a direction in which electrons traveling in the base region are accelerated, and also lattice strain at the boundary of the first and second base regions 12 and 13 is as small as possible. To attain this, the Ge and C contents of the second base-side boundary portion of the first base region 12 are made equal to those of the second base region 13, and the C and Ge contents of the first base region 12 are increased as the position in the first base region 12 is farther from the second base-side boundary portion and closer to the collector buried layer 11.

As shown in FIG. 7A, in this embodiment, the Ge content of the second base region 13 and the Ge content of the second base-side boundary portion of the first base region 12 are set at a common value (for example, 15.2%), while the Ge content of the collector-side boundary portion of the first base region 12 is set at a higher value (for example, 30%). The C content is set at a common value (for example, 0.3%) for the second base region 13 and the second base-side boundary portion of the first base region 12, and at a higher value (for example, 1.4%) for the collector-side boundary portion of the first base region 12. In this case, therefore, the second base region 13 and the second base-side boundary portion of the first base region 12 are made of a $SiGe_{0.152}C_{0.003}$ layer, while the collector-side boundary portion of the first base region 12 is made of a $SiGe_{0.30}C_{0.014}$ layer.

The band gap of the $SiGe_{0.152}C_{0.003}$ layer is about 1.02 eV, while the band gap of the $SiGe_{0.30}C_{0.014}$ layer is about 0.93 eV. Therefore, since the band gap of the first base region 12 gradually decreases from the second base-side boundary portion thereof toward the collector buried layer 11, electrons in the first base region 12 are accelerated by a drift electric field. This shortens the traveling time of the electrons and thereby improves the high-frequency characteristics of the HBT. In addition, since both the Ge and C contents of the first and second base regions 12 and 13 are the same at the boundary thereof, abrupt change in lattice constant is avoided at the boundary. Therefore, lattice strain of the entire base region can be minimized, and thus defects such as dislocation due to lattice strain can be suppressed. This contributes to improvement of the electric characteristics of the HBT.

With the above construction where two SiGeC layers having the same band gap at the boundary thereof are layered one upon the other, further low-voltage driving is attained as in Embodiment 2. In addition, as described above, by interposing the second base region 13 having a low C content between the emitter region 14a and the first base region 12, the recombination current in the emitter-base depletion layer (region Rdp shown in FIG. 7B) can be reduced.

That is, in this embodiment, both the effects described in Embodiments 3 and 4 can be attained.

In the above embodiments, the second base region 13 is constructed of a SiGeC layer. It should be noted that the above embodiments are also applicable to a HBT of which the second base region 13 is constructed of a SiGe layer.

Thus, according to the heterojunction bipolar transistor of the present invention, the C content of the portion of the base region made of a SiGeC layer adjacent to the emitter region is made smaller than the C content of the portion of the base region adjacent to the collector region. This suppresses generation of a recombination current. It is therefore possible to improve the electric characteristics such as the gain and the high-frequency characteristic, while the driving voltage can be reduced.

While the present invention has been described in a preferred embodiment, it will be apparent to those skilled in the art that the disclosed invention may be modified in numerous ways and may assume many embodiments other than that specifically set out and described above.

Accordingly, it is intended by the appended claims to cover all modifications of the invention that fall within the true spirit and scope of the invention.

What is claimed is:

1. A heterojunction bipolar transistor comprising:

a first-conductivity type collector region made of a semiconductor material including Si formed on a substrate;

a second-conductivity type base region made of plural $Si_{1-x-y}Ge_xC_y$ layers ($0<x<1$, $0 \leq y<1$), the plural $Si_{1-x-y}Ge_xC_y$ layers having different C contents and different Ge contents from each other formed on the collector region; and a first-conductivity type emitter region made of a semiconductor material including Si formed on the base region, the emitter region forming heterojunction with the base region, wherein in the plural $Si_{1-x-y}Ge_xC_y$ layers constructing the base region, the C content of a $Si_{1-x-y}Ge_xC_y$ layer adjacent to the collector region is larger than that of a $Si_{1-x-y}Ge_xC_y$ layer adjacent to the emitter region, and the Ge content of the $Si_{1-x-y}Ge_xC_y$ layer adjacent to the collector region is larger than that of the $Si_{1-x-y}Ge_xC_y$ layer adjacent to the emitter region, and the Ge content of the $Si_{1-x-y}Ge_xC_y$ layer adjacent to the collector region increases from the emitter region toward the collector region while the C content of the $Si_{1-x-y}Ge_xC_y$ layer adjacent to the collector region is constant.

2. The heterojunction bipolar transistor of claim 1, wherein the C content of the portion of the base region adjacent to the emitter region is less than 0.8%.

3. The heterojunction bipolar transistor of claim 1, wherein the C content of the portion of the base region adjacent to the emitter region is 0.01% or more.

4. The heterojunction bipolar transistor of claim 1, wherein the heterojunction bipolar transistor is constructed so that a depiction layer formed at an emitter-base junction is within a region adjacent to the emitter region in the base region.

5. The heterojunction bipolar transistor of claim 1, wherein the Ge content of a region adjacent to the emitter region in the base region is constant.

6. The heterojunction bipolar transistor of claim 1, wherein the thickness of the portion of the base layer adjacent to the emitter region is 5 nm or more.

7. The heterojunction bipolar transistor of claim 1, wherein the thickness of the portion of the base layer adjacent to the emitter region is 10 nm or more.

8. The heterojunction bipolar transistor of claim 1, wherein a portion of the base region other than the portion adjacent to the emitter region is constructed so that the band gap decreases as the position in the base region is farther from the emitter region and closer to the collector region.

9. The heterojunction bipolar transistor of claim 1, wherein the band gap of the boundary portion of the $Si_{1-x-y}Ge_xC_y$ layer adjacent to the collector region on the side of the $Si_{1-x-y}Ge_xC_y$ layer adjacent to the emitter region is equal to or smaller than the band gap of the $Si_{1-x-y}Ge_xC_y$ layer adjacent to the emitter region.

10. The heterojunction bipolar transistor of claim 9, wherein a relationship $$\Delta x \geq 4.288 \Delta y$$

is established where $\Delta x$ denotes the difference in Ge content between a boundary portion of the $Si_{1-x-y}Ge_xC_y$ layer adjacent to the collector region on the side of the $Si_{1-x-y}Ge_xC_y$ layer adjacent to the emitter region and the $Si_{1-x-y}Ge_xC_y$ layer adjacent to the emitter region, and $\Delta y$ denotes the difference in C content between the boundary portion of the $Si_{1-x-y}Ge_xC_y$ layer adjacent to the collector region on the side of the $Si_{1-x-y}Ge_xC_y$ layer adjacent to the emitter region and the $Si_{1-x-y}Ge_xC_y$ layer adjacent to the emitter region.

11. The heterojunction bipolar transistor of claim 10, wherein a portion of the $Si_{1-x-y}Ge_xC_y$ layer adjacent to the collector region other than the boundary portion on the side of the $Si_{1-x-y}Ge_xC_y$ layer adjacent to the emitter region is constructed so that the band gap decreases as the portion in the $Si_{1-x-y}Ge_xC_y$ layer adjacent to the collector region is farther from the $Si_{1-x-y}Ge_xC_y$ layer adjacent to the emitter region and closer to the collector region.

12. The heterojunction bipolar transistor of claim 1, herein the Ge content of the $Si_{1-x-y}Ge_xC_y$ layer adjacent to the collector region is 30.0% or more.

13. The heterojunction bipolar transistor of claim 12, wherein content of the $Si_{1-x-y}Ge_xC_y$ layer adjacent to the collector region is 31.3% or more.

* * * * *

UNITED STATES PATENT AND TRADEMARK OFFICE
CERTIFICATE OF CORRECTION

PATENT NO. : 6,759,697 B2
DATED : July 6, 2004
INVENTOR(S) : Kenji Toyoda et al.

It is certified that error appears in the above-identified patent and that said Letters Patent is hereby corrected as shown below:

Title page,
Item [56], References Cited, FOREIGN PATENT DOCUMENTS, should read
-- EP    1 065 728 A2    1/2001 -- rather than "EP        1 085 728 A2    1/2001".

Column 13,
Line 38, change "so that a depiction layer" to -- so that a depletion layer --;

Column 14,
Line 39, the first word in the line "herein" should be changed to -- wherein --.

Signed and Sealed this

First Day of February, 2005

JON W. DUDAS
*Director of the United States Patent and Trademark Office*